(12) United States Patent
Then et al.

(10) Patent No.: US 10,134,727 B2
(45) Date of Patent: *Nov. 20, 2018

(54) HIGH BREAKDOWN VOLTAGE III-N DEPLETION MODE MOS CAPACITORS

(71) Applicant: Intel Corporation, Santa Clara, CA (US)

(72) Inventors: Han Wui Then, Portland, OR (US); Sansaptak Dasgupta, Santa Clara, CA (US); Gerhard Schrom, Hillsboro, OR (US); Valluri R. Rao, Saratoga, CA (US); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 13 days.

This patent is subject to a terminal disclaimer.

(21) Appl. No.: 14/738,799

(22) Filed: Jun. 12, 2015

(65) Prior Publication Data

US 2016/0365341 A1  Dec. 15, 2016
US 2017/0133364 A9  May 11, 2017

Related U.S. Application Data

(63) Continuation of application No. 13/631,569, filed on Sep. 28, 2012, now Pat. No. 9,064,709.

(51) Int. Cl.
*H01L 29/00* (2006.01)
*H01L 27/06* (2006.01)
(Continued)

(52) U.S. Cl.
CPC ...... *H01L 27/0629* (2013.01); *H01L 21/8252* (2013.01); *H01L 21/8258* (2013.01);
(Continued)

(58) Field of Classification Search
CPC ... H01L 27/0629; H01L 29/945; H01L 29/04; H01L 29/7787; H01L 29/1095; H01L 29/205; H01L 29/2003
See application file for complete search history.

(56) References Cited

U.S. PATENT DOCUMENTS 5,479,316 A   12/1995   Smrtic et al.
8,390,000 B2  3/2013    Chu et al.
(Continued)

FOREIGN PATENT DOCUMENTS

CN   1557024 A    12/2004
CN   101562182 A  10/2009
(Continued)

OTHER PUBLICATIONS

Office Action including Search Report from the Examiner of Intellectual Property Office (the IPO) dated Jun. 23, 2016 for Taiwan Patent Application No. 104128160 and English Translation thereof.
(Continued)

*Primary Examiner* — Dale E Page
*Assistant Examiner* — Quovaunda V Jefferson
(74) *Attorney, Agent, or Firm* — Schwabe, Williamson & Wyatt, P.C.

(57) ABSTRACT

III-N high voltage MOS capacitors and System on Chip (SoC) solutions integrating at least one III-N MOS capacitor capable of high breakdown voltages (BV) to implement high voltage and/or high power circuits. Breakdown voltages over 4V may be achieved avoiding any need to series couple capacitors in an RFIC and/or PMIC. In embodiments, depletion mode III-N capacitors including a GaN layer in which a two dimensional electron gas (2DEG) is formed at threshold voltages below 0V are monolithically integrated with group IV transistor architectures, such as planar and non-planar silicon CMOS transistor technologies. In embodi- (Continued)

ments, silicon substrates are etched to provide a (111) epitaxial growth surface over which a GaN layer and III-N barrier layer are formed. In embodiments, a high-K dielectric layer is deposited, and capacitor terminal contacts are made to the 2DEG and over the dielectric layer.

23 Claims, 9 Drawing Sheets

(51) Int. Cl.
| | |
|---|---|
| H01L 29/94 | (2006.01) |
| H01L 29/04 | (2006.01) |
| H01L 29/778 | (2006.01) |
| H01L 29/10 | (2006.01) |
| H01L 29/205 | (2006.01) |
| H01L 29/20 | (2006.01) |
| H01L 29/66 | (2006.01) |
| H01L 29/06 | (2006.01) |
| H01L 21/8252 | (2006.01) |
| H01L 21/8258 | (2006.01) |

(52) U.S. Cl.
CPC .......... *H01L 27/0605* (2013.01); *H01L 29/04* (2013.01); *H01L 29/0657* (2013.01); *H01L 29/1095* (2013.01); *H01L 29/2003* (2013.01); *H01L 29/205* (2013.01); *H01L 29/66181* (2013.01); *H01L 29/7787* (2013.01); *H01L 29/94* (2013.01); *H01L 29/945* (2013.01); *H01L 29/045* (2013.01)

(56) References Cited

U.S. PATENT DOCUMENTS

| | | | | |
|---|---|---|---|---|
| 9,064,709 | B2* | 6/2015 | Then | H01L 29/94 |
| 2002/0017696 | A1* | 2/2002 | Nakayama | H01L 21/28587 |
| | | | | 257/471 |
| 2002/0069816 | A1 | 6/2002 | Gehrke et al. | |
| 2002/0142741 | A1 | 10/2002 | Molnar et al. | |
| 2003/0020092 | A1 | 1/2003 | Parikh et al. | |
| 2004/0094759 | A1 | 5/2004 | Nguyen et al. | |
| 2005/0104083 | A1 | 5/2005 | Bader et al. | |
| 2007/0123003 | A1 | 5/2007 | Brask et al. | |
| 2007/0269968 | A1 | 11/2007 | Sexier et al. | |
| 2008/0079023 | A1 | 4/2008 | Hikita et al. | |
| 2008/0161073 | A1 | 7/2008 | Park et al. | |
| 2009/0001423 | A1* | 1/2009 | Mishima | H01L 29/0843 |
| | | | | 257/194 |
| 2009/0261363 | A1* | 10/2009 | Chen | H01L 21/02381 |
| | | | | 257/95 |
| 2010/0006913 | A1* | 1/2010 | Lin | H01L 21/76232 |
| | | | | 257/301 |
| 2010/0025201 | A1 | 2/2010 | Mittu et al. | |
| 2010/0046285 | A1 | 2/2010 | Lung | |
| 2010/0140660 | A1 | 6/2010 | Wu et al. | |
| 2010/0140663 | A1 | 6/2010 | Hopper et al. | |
| 2011/0049526 | A1* | 3/2011 | Chu | H01L 21/28587 |
| | | | | 257/76 |
| 2011/0180806 | A1 | 7/2011 | Hebert | |
| 2011/0193619 | A1 | 8/2011 | Parikh et al. | |
| 2011/0309372 | A1 | 12/2011 | Xin et al. | |
| 2012/0211812 | A1 | 8/2012 | Du et al. | |
| 2012/0223320 | A1 | 9/2012 | Dora | |
| 2012/0228625 | A1 | 9/2012 | Ikeda | |
| 2012/0276722 | A1 | 11/2012 | Chyi et al. | |
| 2013/0001646 | A1 | 1/2013 | Corrion et al. | |
| 2013/0057489 | A1 | 3/2013 | Morton et al. | |
| 2014/0001479 | A1 | 1/2014 | Kudymov | |

FOREIGN PATENT DOCUMENTS

| | | |
|---|---|---|
| CN | 102598275 A | 7/2012 |
| JP | 2008-016464 | 1/2008 |
| JP | H2012-178553 | 9/2012 |
| KR | 10-2011-0088460 | 8/2011 |
| TW | 200809981 A | 2/2008 |
| TW | 200830531 A | 7/2008 |
| TW | 201010061 A | 3/2010 |
| TW | 201140820 A | 11/2011 |
| TW | 201205802 A | 2/2012 |
| WO | WO 2003/032397 A1 | 4/2003 |

OTHER PUBLICATIONS

Extended European Search Report from the European Patent Office dated Sep. 15, 2016 for European Patent Application No. 13842878. 4-1552/2901481, PCT/US2013/046896 (11 pages).
Office Action and Search Report from the Intellectual Property Office dated Apr. 1, 2015, Taiwan Patent Application No. 102133677 and English Translation thereof.
W. Huang et al. "Comparison of MOS Capacitors on N- and P-Type GaN", Journal of Electronic Materials, vol. 35, Issue 4, pp. 726-732, 2006.
International Preliminary Report and Written Opinion dated Apr. 9, 2015 for PCT/US2013/046896, International filing date Jun. 20, 2013, 7 pages.
International Search Report and Written Opinion dated Sep. 25, 2013 for PCT/US2013/046896 filed Jun. 20, 2013.
First Office Action from the Chinese Patent Office dated Oct. 21, 2016 for Chinese Patent Application 201380045147.6 (5 pages).
Communication and Supplementary European Search Report from the European Patent Office dated May 31, 2016, 7 pages.
J.C. Zolper et al., "Ion Implantation in Wide Bandgap Semiconductor Device Needs and Technological Challenges" Electrochemical Society Proceedings, vol. 97-34, XP009039773, pp. 76-82.
Notice of Preliminary Rejection (Non-Final) from the Korean Intellectual Property Office (KIPO) for Korean Patent Application No. 10-2015-7004722.
Notice of Preliminary Rejection (4 pages) from the Korean Intellectual Property Office (KIPO) dated Dec. 26, 2016 for Korean Patent Application 10-2015-7004722 and Summary (1 page) thereof.
Chinese PRC State Intellectual Property Office (SIPO) 'Notice of Granting Patent Right for Invention,' for counter-part Chinese Application No. 201380045147.6, dated Mar. 24, 2017, with translation, 3 pages.
Notice of Preliminary Rejection for Korean Patent Application No. 10-2017-7027507 dated Nov. 14, 2017, 8 pgs., no English translation.
Notice of Allowance for Korean Patent Application No. 10-2015-707004722 dated Jul. 25, 2017, 2 pgs., no English translation.
Office Action from Korean Patent Application No. 10-2017-7027507 dated May 21, 2018, and English Summary thereof, 4 pages.

* cited by examiner

PLANAR →      NON PLANAR →

HIGH BREAKDOWN VOLTAGE III-N
DEPLETION MODE MOS CAPACITORS

This is a Continuation application of Ser. No. 13/631,569 filed Sep. 28, 2012, which is presently pending.

TECHNICAL FIELD

Embodiments of the present invention generally relate to microelectronic devices, and more particularly to group III-N MOS capacitors and their integration with silicon-based active devices.

BACKGROUND

The mobile computing (e.g., smart phone and tablet) markets benefit from smaller component form factors and lower power consumption. Because current platform solutions for smart phones and tablets rely on multiple packaged integrated circuits (ICs) mounted onto a circuit board, further scaling to smaller and more power efficient form factors is limited. For example, a smart phone today will include a separate power management IC (PMIC), radio frequency IC (RFIC), and WiFi/Bluetooth/GPS IC, in addition to a separate logic processor IC. System-on-Chip (SoC) architectures offer the advantage of scaling which cannot be matched by board-level component integration.

Besides transistors, passives such as capacitors and inductors are key components in PMICs and RFICs. In a PMIC, capacitors are employed as filters and charge storage elements in switching DC-DC convertors. In an RFIC, capacitors are used in DC blocking and matching network elements. Conventional on-chip metal-insulator-metal (MIM) capacitors today typically have a maximum rating of 1V and the insulator will irreversibly break down when stressed to higher voltages. In PMIC and RFIC applications, voltages in excess of 1V are not uncommon and because of limitations on the MIM dielectric thickness, some implementations connect multiple capacitors in series (e.g., four 1V rated MIM capacitors in serial coupled to permit 4V operation). However, series connecting MIMs requires multiple interconnect metal levels and a large capacitor area. As such, capacitors often occupy a significant proportion of the PMIC and RFIC. In some implementations, one third, or more, of the chip area may be occupied by capacitors.

BRIEF DESCRIPTION OF THE DRAWINGS

Embodiments of the present invention are illustrated by way of example, and not by way of limitation, and can be more fully understood with reference to the following detailed description when considered in connection with the figures, in which.

DETAILED DESCRIPTION

Figure 1A:
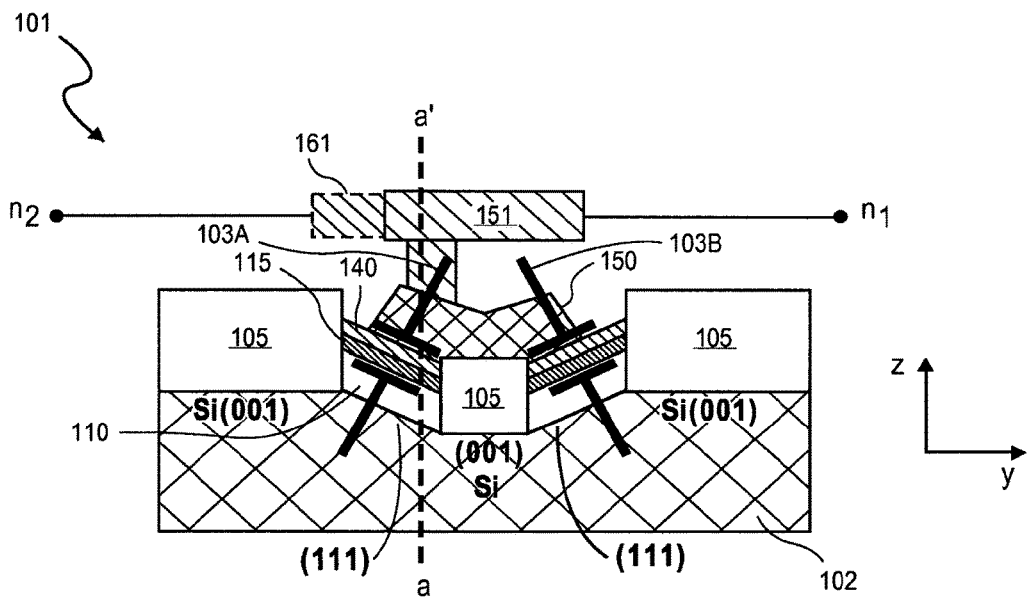
FIGS. 1A and 1B illustrate cross-sectional views of a planar III-N MOS capacitor, in accordance with an embodiment.

In the following description, numerous details are set forth, however, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" means that a particular feature, structure, function, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the two embodiments are not mutually exclusive.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" my be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one material layer with respect to other layers. As such, for example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer.

Described herein are III-N high voltage MOS capacitors and SoC solutions integrating such III-N MOS capacitors to implement high voltage and/or high power circuits. Breakdown voltages over 4V may be achieved for each III-N MOS capacitor, much higher than is possible for either silicon MOS capacitors or MIM capacitors, accommodating the higher voltages found in an RFIC and/or PMIC without need for serially coupled capacitor circuits. For example, a single III-N MOS capacitor may be utilized where four serially connected conventional MIM capacitors might otherwise be required. For embodiments where the III-N MOS capacitor has sufficiently high capacitance (e.g., at least ⅓ of that of the conventional MIM), an overall reduction in capacitor area can be achieved, permitting a form factor shrink and/or higher levels of integration. Furthermore, a reduction in metallization routing (e.g., one metal level rather than two metal levels) can be realized through the use of III-N MOS capacitors.

In particular embodiments, III-N MOS capacitors are employed in SoC architectures integrating high power wireless data transmission and/or high voltage power management functions with low power CMOS logic data processing. High voltage operation that may be accommodated by the III-N MOS capacitors enables high RF output power to be generated for wireless data transmission applications. The high voltage capability also makes the III-N MOS capacitors described herein applicable for high speed switching applications in DC-to-DC converters utilizing inductive elements of reduced size. As both the power amplification and DC-to-DC switching applications are key functional blocks in smartphones, tablets, and other mobile platforms, the structures described herein may be advantageously utilized in a SoC solution for such devices.

In embodiments, the III-N MOS capacitor is an n-type depletion mode device, including a GaN layer in which a two dimensional electron gas (2DEG) is formed at a heterointerface with another III-N layer at capacitor node voltages below 0V. A III-N MOS capacitor also has favorable LCR properties as compared to a conventional silicon MOS capacitor, due at least in part to the high 2DEG densities effectively reducing capacitor terminal resistance. III-N MOS capacitor embodiments include two terminal and three terminal designs where multiple terminals are tied to a common capacitor node voltage. In further embodiments, a III-N MOS capacitor is monolithically integrated with group IV transistor architectures, such as planar and non-planar silicon CMOS transistor technologies as part of an SoC architecture. In certain such embodiments, silicon substrates are etched to provide a (111) epitaxial growth seeding surface over which a GaN layer and III-N barrier layer are formed. A high-K dielectric layer is deposited, and a contact is made to the 2DEG and over the dielectric layer.

Figure 1B:
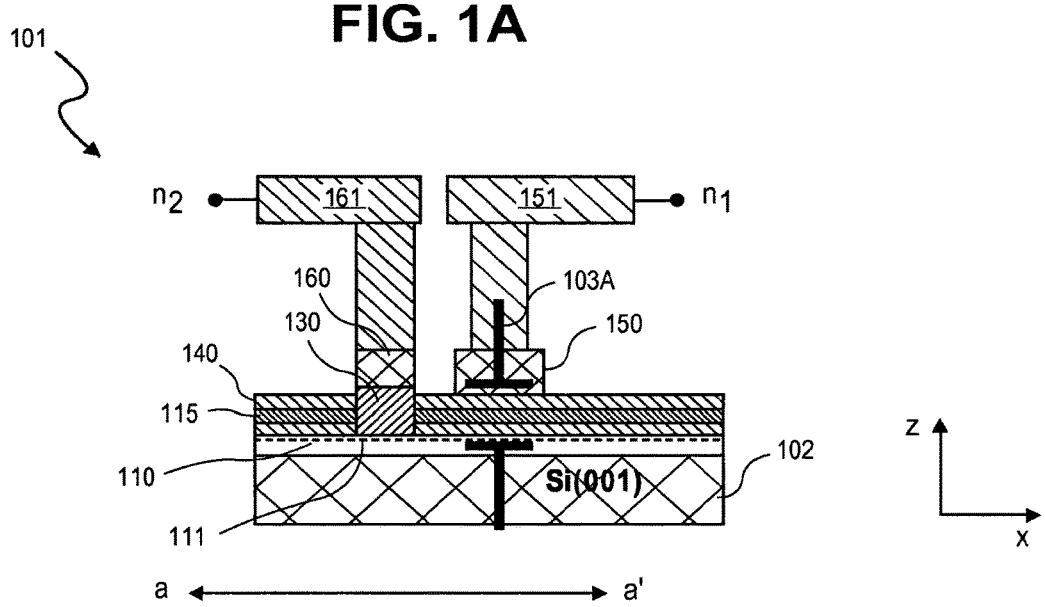
Figure 2A:
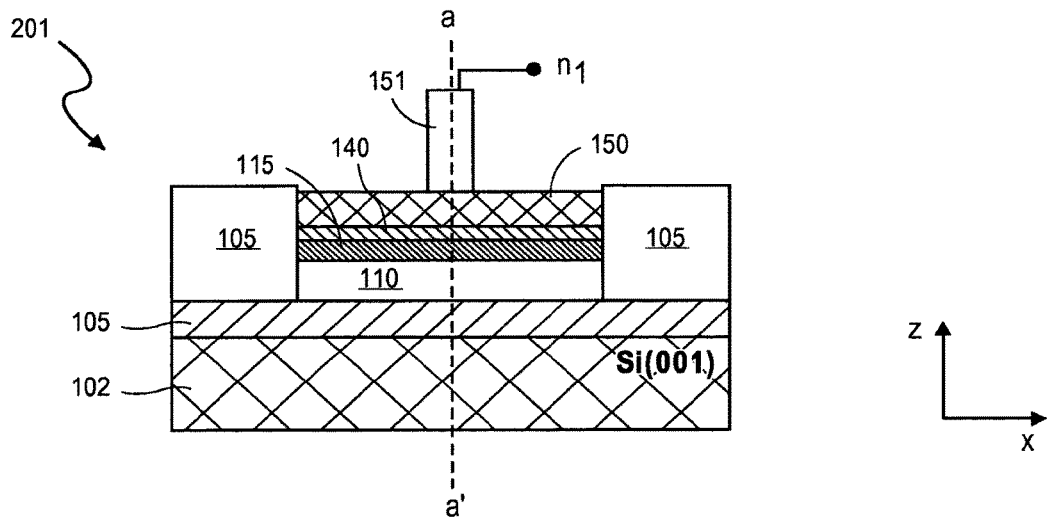
FIGS. 2A and 2B illustrate cross-sectional views of a planar III-N MOS capacitor, in accordance with an embodiment.
Figure 2B:
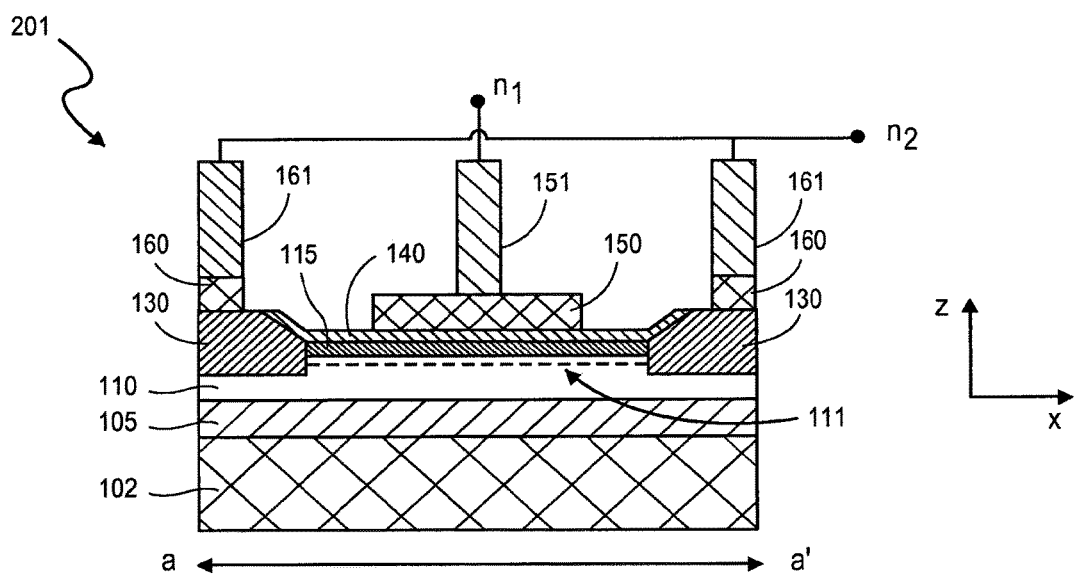
Figure 4A:
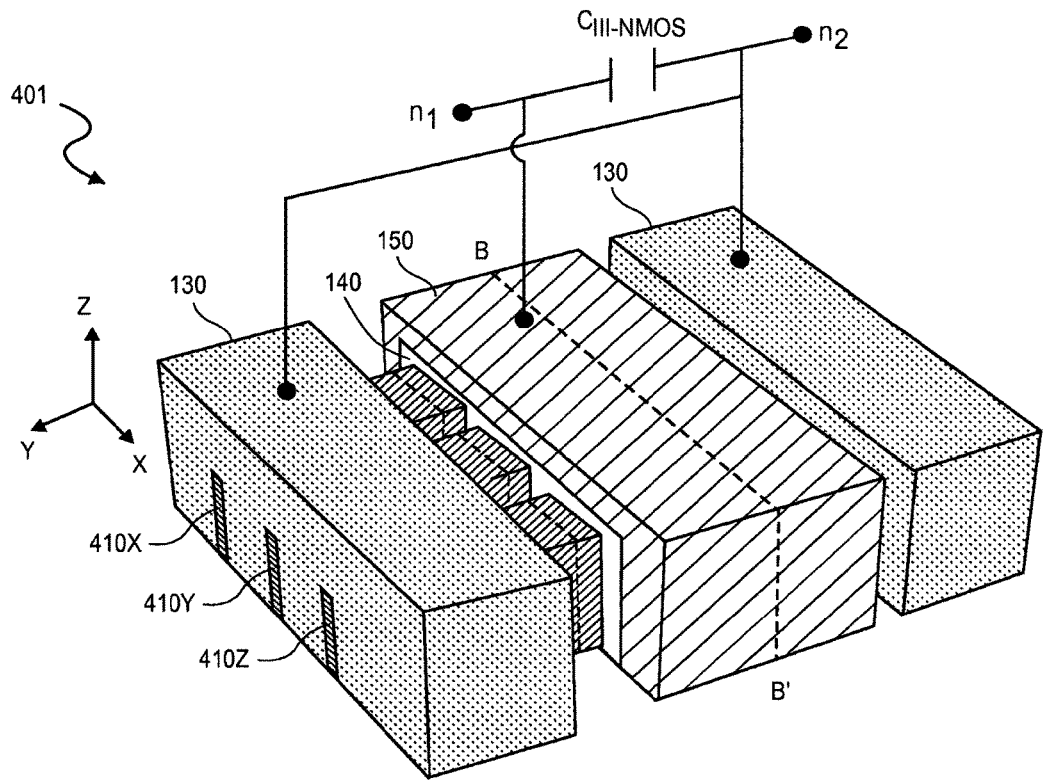
FIGS. 4A, and 4B, illustrate isometric and cross-sectional views of a non-planar III-N MOS capacitor, in accordance with an embodiment.
Figure 4B:
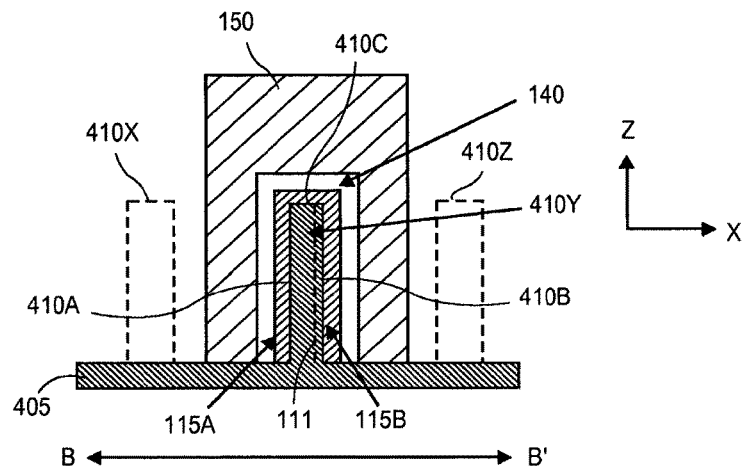

Embodiments of III-N MOS capacitors include planar forms and non-planar forms. FIGS. 1A and 1B illustrate cross-sectional views of a planar III-N MOS capacitor 101, in which an epitaxial GaN layer is disposed directly on a silicon surface, in accordance with an embodiment. FIGS. 2A and 2B illustrate cross-sectional views of a planar III-N MOS capacitor 201, in which an epitaxial GaN layer is disposed on an intervening buffer layer disposed on a silicon surface, in accordance with an embodiment. FIGS. 4A and 4B illustrate isometric and cross-sectional views of a non-planar III-N MOS capacitor 401, in accordance with an embodiment.

In embodiments, a III-N MOS capacitor is disposed over a (001) or (110) silicon substrate. Referring first to FIG. 1A, and FIG. 1B that is a cross-sectional view along the plane denoted in by the dashed a-a' line in FIG. 1A, the planar III-N MOS capacitor 101 is disposed over a (001) silicon substrate 102. The quality of epitaxial growth of III-nitrides is dependent on the lattice mismatch between the underlying substrate and the III-nitride material. A group III-nitride, such as GaN, has the wurtzite crystal structure, for which the lattice constant a is relatively small (~3.189 Å), and therefore the mismatch to conventional silicon substrates is large (~41% to both (001) and (110) planes of silicon having a lattice constant a of ~5.43 Å). The silicon (111) plane, having a lattice parameter of only 3.84 Å, offers a smaller mismatch to GaN (~17%). Therefore, better quality GaN films may be epitaxially grown on (111) silicon substrates. (111) silicon substrates however are much more expensive and indeed currently limited in size to only 200 mm. Such a limitation in substrate size is not merely a significant disadvantage with respect to cost per device fabricated, but may foreclose the possibility of employing the most advanced fabrication techniques to form III-N MOS capacitors as the equipment for advanced CMOS processing is generally engineered only to handle the standard dimensioned silicon substrates typically used in silicon FET fabrication for CMOS technology (e.g., currently 300 mm).

In embodiments, a III-N MOS capacitor disposed over a (001) or (110) silicon substrate and includes a GaN layer 110 disposed on a (111) silicon surfaces of the substrate. For the exemplary III-N MOS capacitor 101, the GaN layer 110 is disposed on etched surfaces of the substrate 102 that form a v-groove. The (111) surfaces are slanted by approximately 55° relative to a top surface of the substrate that is on a (001) plane. The (111) surface may be exposed for example by etching with a suitable wet chemistry, such as, but not limited to, KOH solutions. The GaN layer 110 disposed over the (111) surface, is substantially single crystalline and although is referred to herein as "monocrystalline," one of ordinary skill will appreciate that a low level of crystal defects may nevertheless be present as artifacts of an imperfect epitaxial growth processes seeding off a (111) silicon surface. Within the GaN layer 110, there is a crystalline arrangement having the wurtzite structure in which the c-axis is perpendicular to the silicon (111) plane. The GaN layer 110 is non-centrosymmetric, meaning that the crystal lacks inversion symmetry, and more particularly the {0001} planes are not equivalent. One of the GaN {0001} planes is typically referred to as the Ga-face (+c polarity) when and the other referred to as the N-face (−c polarity). Often for planar group III-N devices, one or the other of {0001} planes is more proximate a substrate surface and so may be referred to as Ga polarity (+c) if the three bonds of the Ga (or other group III element) point towards the substrate or N polarity (−c) if the three bonds of the Ga (or other group III element) point away from the substrate. In the exemplary planar III-N MOS capacitor 101, the wurtzite crystal orientation is such that the (0001) plane forms a top surface of the crystal (e.g., GaN layer 110, or an overlying epitaxial III-N layer).

In embodiments, the GaN layer 110 is undoped with formation of the 2DEG being a result of the non-centrosymmetric structure and heterointerface formed with a III-N barrier layer 115. The GaN layer 110 is therefore free of junctions formed by impurity dopant gradients, and as such, disadvantages associated with dopant diffusion, scattering, and breakdown voltage degradation are avoided. While the thickness (z-dimension) of the GaN layer 110 may vary with implementation, exemplary thicknesses are between 5 nm and 20 nm. Although the III-N MOS capacitor 101 exemplifies an embodiment in which a 2DEG is to be formed in the GaN layer 110, other III-N MOS capacitor embodiments may employ other III-N materials as an alternate to GaN and still retain many of the features described herein. For example, a ternary alloy of GaN, such as aluminum gallium nitride ($Al_xGa_{1-x}N$), indium nitride (InN), a ternary alloy of InN, such as aluminum indium nitride ($Al_xIn_{1-x}N$), or a quaternary alloy including at least one group III element and nitrogen, such as $In_xAl_yGa_{1-x-y}N$, are all possible.

As further illustrate in FIG. 1A, the III-N MOS capacitor 101 further includes growth blocking masks 105 disposed over planes other than (111) planes to prevent epitaxial growth of the GaN layer 110 on these other silicon planes (e.g., the (001) planes depicted). As such, epitaxial growth of the GaN layer 110 is selective to the (111) planes and confined to the trenches between the growth blocking masks 105. Hence, in advantageous embodiments, the GaN layer 110 is grown by metalorganic chemical vapor deposition (MOCVD) or metalorganic vapor phase epitaxy (MOVPE), which are more selective techniques than line-of-site techniques, such as molecular beam epitaxy (MBE). The growth blocking masks 105 may be any conventional dielectric, such as but not limited to oxides (e.g., silicon dioxide) deposited for example by chemical vapor deposition (CVD) or plasma enhanced CVD (PECVD). The trench confining may permit independent GaN crystal growth on the complementary (111) planes illustrated in FIG. 1A to increase the areal density of the III-N MOS capacitor 101 (e.g., forming planar MOS capacitors 103A and 103B) with only the blocking mask 105 disposed at the intersection of the (111) planes reducing the capacitive area from that of a mask area in which the (001) surface is etched to expose the (111) planes.

As further illustrated in FIGS. 1A and 1B, disposed over the GaN layer 110 is a III-N barrier layer 115. In the exemplary embodiment, the III-N barrier layer 115 is disposed directly on a (0001) surface of the GaN layer. In embodiments the III-N barrier layer 115 is of a composition that induces a 2DEG (depicted as dashed line 111 in FIG. 1B) even in the absence of a positive voltage applied to the capacitor node $n_1$ relative to a ground potential applied to the capacitor node $n_2$. In the exemplary embodiment the III-N MOS capacitor 101 is a depletion mode device with a negative threshold voltage. As such, the III-N MOS capacitance will be relatively constant over a wide range of relevant operating voltages exceeding the negative threshold voltage (e.g., –4V to 2V, –1V to 5V, etc.). In the context of the III-N MOS capacitor 101, the 2DEG is not relied upon for carrier transport, but rather as a low conductivity extension of the plate voltage potential applied at the capacitor node $n_2$ resulting in a capacitance associated with the heterointerface between the GaN layer 110 and the barrier layer 115.

Generally, any group III-N materials with a larger bandgap than the GaN layer 110 may be utilized for the barrier layer 115. Preferably, the barrier layer 115 is substantially monocrystalline (i.e., having a thickness below the critical thickness for the given composition), or is lattice matched to the GaN layer 110. Composition of the barrier layer 115 may be chosen to ensure depletion mode operation. In one exemplary embodiment the barrier layer 115 a quaternary alloy including at least three group III element and nitrogen, such as $In_{1-x-y}Al_xGa_yN$, where x>0 and y<1. Such a barrier layer composition is capable of generating a 2DEG at negative threshold voltages (across nodes $n_1$ and $n_2$) and may be tuned to be less negative as the composition progresses toward AlInN. In embodiments the barrier layer 115 has only intrinsic impurity doping level (i-$In_{1-x-y}Al_xGa_yN$). In another embodiment, the barrier layer 115 is a ternary alloy including at least two group III elements and nitrogen, such as $Al_xGa_{1-x}N$, or $In_zGa_{1-z}N$. In further embodiments, the barrier layer 115 may be a multilayer stack of group III-nitrides, for example, an $Al_xIn_{1-x}N/In_zGa_{1-z}N$ stack with either layer being in contact with the GaN layer 110. As a result of different polarizations of the GaN layer 110 and the barrier layer 115, a density of sheet charge may be modulated by setting a thickness to which the barrier layer 115 is epitaxially grown over the GaN layer 110 (e.g., by MOVPE or MOCVD). Depending on the embodiment, the barrier layer 115 may range from between 1 nm and 10 nm in thickness.

In embodiments, a III-N MOS capacitor includes a high-k dielectric layer. As shown in FIGS. 1A and 1B, a capacitor dielectric layer 140 is disposed on the barrier layer 115. In embodiments, the dielectric constant of the capacitor dielectric layer 140 is at least 7, and advantageously greater than 10. Exemplary dielectric materials include, but are not limited to metal oxides such as $Gd_2O_3$, $HfO_2$, $Ta_2O_5$, and $TiO_2$, metal silicates such as HfSiO, TaSiO, and AlSiO, and metal oxynitrides such as HfON, are suitable for the capacitor dielectric layer 140. Metal silicates, such as ZrSiO, may also be suitable, but have a somewhat lower critical breakdown field (e.g., 6 MV/cm) potentially reducing safe operating voltages for the III-N MOS capacitor. Similarly, materials with lower dielectric constant, such as silicon nitrides ($Si_xN$) and alumina ($Al_2O_3$), which have a critical breakdown field exceeding 12 MV/cm (~4 times than of GaN), may also be suitable. However, scaling of the dielectric layer 140 to lower equivalent oxide thicknesses (EOT) is more limited for those materials potentially reducing maximum capacitance/area for the III-N MOS capacitor 101. Furthermore, any combinations of these metal oxides, metal silicates, and lower k silicon nitrides, alumina, silicon oxide may also be used. The capacitor dielectric layer 140 may further serve to passivate the interface between the capacitor contact metal 150 and top surface of the III-N semiconductor (e.g., top surface of barrier layer 115) to reduce leakage current of the III-N MOS capacitor 101. High quality passivation is achieved in one embodiment by depositing the capacitor dielectric layer 140 by atomic layer deposition (ALD).

The density of sheet charge provided within the 2DEG 111 can be modulated through selection of the work function for the contact metal 150. As such for the exemplary depletion mode embodiments, the contact metal 150 has an n-type metal work function (i.e.,), and more specifically has a work function not higher than 4.6 eV, and advantageously 4.3 eV, or lower. Exemplary contact metals include, but are not limited to, titanium (Ti), aluminum (Al), tantalum (Ta), TaN, TiN, gadolinium (Gd), ytterbium (Yb), and alloys thereof. Various metals with higher work function e.g. nickel (Ni), tungsten (W), palladium (Pd), and alloys thereof may be used as diffusive barrier as well as filler/bulk metal. A routing metal 151 is further disposed on the first contact metal 150 to electrically connect the first contact metal 150, as a first capacitor node $n_1$, to other circuit nodes of an IC. The routing metal 151 may be any conventional metal, such as but not limited to copper (Cu). With the first contact metal 150 coupled to the first capacitor node $n_1$, a second contact metal 160 is illustrated in FIG. 1B. Generally, the second contact metal 160 may be any n-type work function metal, such as any of those described for the first contact metal 150. In the exemplary embodiment, the second contact metal 160 is of the same composition as the first contact metal 150. In other embodiments, the first and second contact metals 150, 160 may be of differing composition. A routing metal 161 (e.g., Cu) is further disposed on the second contact metal 160 to electrically connect the second contact metal 160, as a second capacitor node $n_2$, to other circuit nodes of an IC.

As further illustrated in FIG. 1B, the second contact metal contacts an impurity doped semiconductor region 130. The impurity doped (e.g., N+) semiconductor region 130 may be of any low bandgap group III-N material, such as $In_xGa_{1-x}N$ and InN, for formation of low resistance contacts, or simply n-type GaN. The doped semiconductor region 130 is in contact with the portion of the GaN layer 110 where the sheet charge 111 resides. In certain embodiments, the GaN layer 110 is recessed between 2 and 20 nm from the interface of the barrier layer 115 and the doped semiconductor region 130 epitaxially grown or deposited in the recess. In one exemplary embodiment, the doped semiconductor region 130 is InGaN with n-type doping levels of up to 2e20 $cm^{-3}$.

In embodiments, a III-N MOS capacitor is disposed over a (100) silicon surface with a III-N semiconductor buffer layer disposed between the capacitor and the silicon substrate. As described previously, because silicon, and more particularly (100) silicon, is advantageous for the fabrication of silicon MOS transistors, a buffer layer may be used to accommodate the more extreme lattice mismatch between (100) silicon seeding surfaces and the exemplary GaN layer of a III-N MOS capacitor. FIGS. 2A and 2B illustrate cross-sectional views equivalent to those of FIGS. 1A and 2B, respectively, for an embodiment employing a semiconductor buffer layer 107. Generally, with the buffer layer 107 properly oriented, the c-axis of the GaN layer 110 is oriented perpendicular to the (100) surface of the silicon substrate 102. The buffer may be of any composition, number of layers, thickness, etc. known in the art to be suitable for a silicon substrate. In the exemplary embodiment illustrated in FIG. 2A, the buffer layer 107 includes a III-N material other than GaN. In further embodiments, the buffer layer 107 is of a thickness sufficient to fully relax.

As further illustrated in FIGS. 2A and 2B, the GaN layer 110, barrier layer 115, capacitor dielectric layer 140, and first contact metal 150 are all disposed over the buffer layer 107. For each of these layers, the material compositions, thicknesses, etc. are any of those described elsewhere herein in the context of the III-N MOS capacitor 101 and a same reference number is utilized for like structures to emphasize this point. As further illustrated in FIG. 2B, a plurality of second contact metals 160 are coupled to n-type doped semiconductor region 130 raised from the GaN layer 110. The second contact metals 160 are disposed on opposite sides of the first contact metal 150 and are electrically connected to the same second capacitor node $n_2$, which for example is held at a reference voltage level such as ground while a positive or negative voltage is applied to the first capacitor node $n_1$. The planar III-N MOS capacitor 201 therefore is operable just as described for the planar III-N MOS capacitor 101. For example, in embodiments the III-N MOS capacitor 201 is a depletion mode n-type device.

Figure 3:
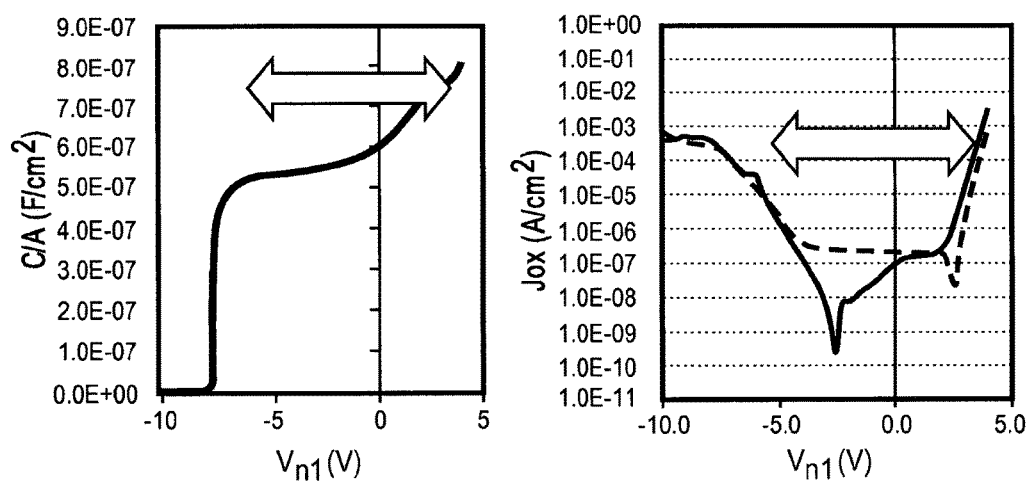
FIG. 3 illustrates experimental data showing performance data for a planar III-N MOS capacitor, in accordance with an embodiment.

FIG. 3 illustrates experimental data showing performance data for a planar GaN MOS capacitor, in accordance with an embodiment. As shown, no breakdown occurs for +/−4V charging and a relatively high capacitance per unit area of 6 nF/mm2 is achieved with low leakage of less than $1e^{-3}$ A/cm (where the dashed line in the leakage graph is the leakage current in a reverse sweep of the voltage). With the ability to adjust the threshold voltage to be more or less negative, the operating range over which there is a relatively constant capacitance/unit area (represented by the two headed open arrow) may be tailored to match the needs of a given circuit application.

In embodiments, a III-N MOS capacitor includes a non-planar III-N body. FIG. 4A is an isometric illustration of the III-N MOS capacitor 401, in accordance with an embodiment. FIG. 4B is a cross-sectional illustration of one fin portion of the non-planar III-N MOS capacitor 401 on a plane B passing through the first contact metal 150, in accordance with an embodiment. Generally, each non-planar, polar crystalline GaN semiconductor body 410X, 410Y, 410Z has a top surface 410C disposed between first and second opposite sidewalls, 410A and 410B extending from a bulk polar crystalline semiconductor layer 405 (FIG. 4B). While the non-planarity of the GaN bodies 410X, 410Y, 410Z may resemble a "fin" structure which has become popular in silicon technology, as described further herein, unlike a silicon finFET, the polarity of the atomic bonds within each GaN body 410X, 410Y, 410Z render the capacitor 401 "asymmetrical." This asymmetry is manifested primarily in the location of the 2DEG, which may be more proximate to one of the first or second opposite sidewalls 410A, 410B even though the mechanical structure of the non-planar GaN bodies 410X, 410Y, 410Z and overlying layers are substantially symmetrical about a longitudinal centerline of each body (i.e., along the y-axis). Although the non-planar bodies 410X, 410Y, 410Z are of gallium nitride (GaN) in the exemplary embodiment, any of the alternatives described elsewhere herein for the GaN layer in the planar III-N MOS capacitors 101 and 201 may also be utilized.

For the exemplary GaN embodiment, the width (x-dimension) of each non-planar body 410X, 410Y, or 410Z is between 5 and 10 nanometers (nm) and the height (z-dimension) is between 25 and 50 nm. As describe further elsewhere herein, in certain embodiments the z-dimension of the 2DEG 111 is therefore on the order of 50 nm because of the asymmetry of each GaN body. In the exemplary embodiment, two doped semiconductor regions 130 are spaced apart from the area of the capacitor occupied by the first contact metal 150. The doped semiconductor regions 130 are further coupled to contact metals (not depicted) as described for the planar III-N MOS capacitors 101 and 201.

Reference labels employed for the planar III-N capacitor embodiments are retained in the FIGS. 4A and 4B for functionally equivalent structures, and as such, any of the material compositions and thicknesses, etc. described for such structures are directly applicable to the non-planar III-N capacitor 401. For example, as shown in FIG. 4B, each non-planar GaN body (e.g., 410Y) is covered with the III-N barrier layer 115 disposed over the first and second sidewalls 410A and 410B, as well as over the top surface 410C. The composition of the III-N barrier layer 115 may be any of those described in the context of the planar III-N MOS capacitors 101 or 201. Although the III-N barrier layer 115 is of the same composition and present in substantially the same amount along both of the first and second sidewalls 410A and 410B, as a result of the asymmetry induced by the polar bonds within the non-planar body, and the polarization direction stemming from these bonds with respect to the III-N barrier layer 115, the layer may be functionally divided into regions 115A and 115B, disposed on the sidewalls 410A, 410B, respectively. In embodiments, the crystal orientation of the GaN bodies (e.g., body 410Y) is such that the first sidewall 410A is substantially along the $(000\bar{1})$ plane. Similarly, the second sidewall 410B is substantially along the (0001) plane. The spontaneous polarization field, $P_{SP}$ within each non-planar GaN body is therefore directed from the second sidewall 410B to the first sidewall 410A. As such, the polarization of the non-planar III-N capacitor 401 is through the width of each body (e.g., 410Y), laterally along the x-dimension, rather than vertically through the body thickness along the z-dimension. In other words, the non-planar III-N capacitor 401 is oriented substantially orthogonal to that of the planar III-N MOS capacitor 201 and by 35° from that of the planar III-N MOS capacitor 101.

Generally, for the non-planar III-N capacitor 401, proximity (approximately less than 50 nm from the 0001 surface) of the 000T̄ surface will reduce the 2DEG density proximate the 0001 interface than if it was not present. However, one advantage of the non-planar architecture is that many narrow fins can be packed in a given area, with the active capacitive area being determined by the sum of the z-heights of the fins rather than a planar area as for the planar MOS capacitors 101 and 201. Thus, despite a lower 2DEG density per fin, a higher total capacitance can be achieved per given planar area by packing more fins together. Hence, the multi-fin structure 401, with the first capacitor terminal disposed over all fins, and the second capacitor terminal connecting together the 2DEG of each fin offers an advantageous total capacitance/area along with the same high BV described elsewhere herein in terms of the planar embodiments.

Figure 5:
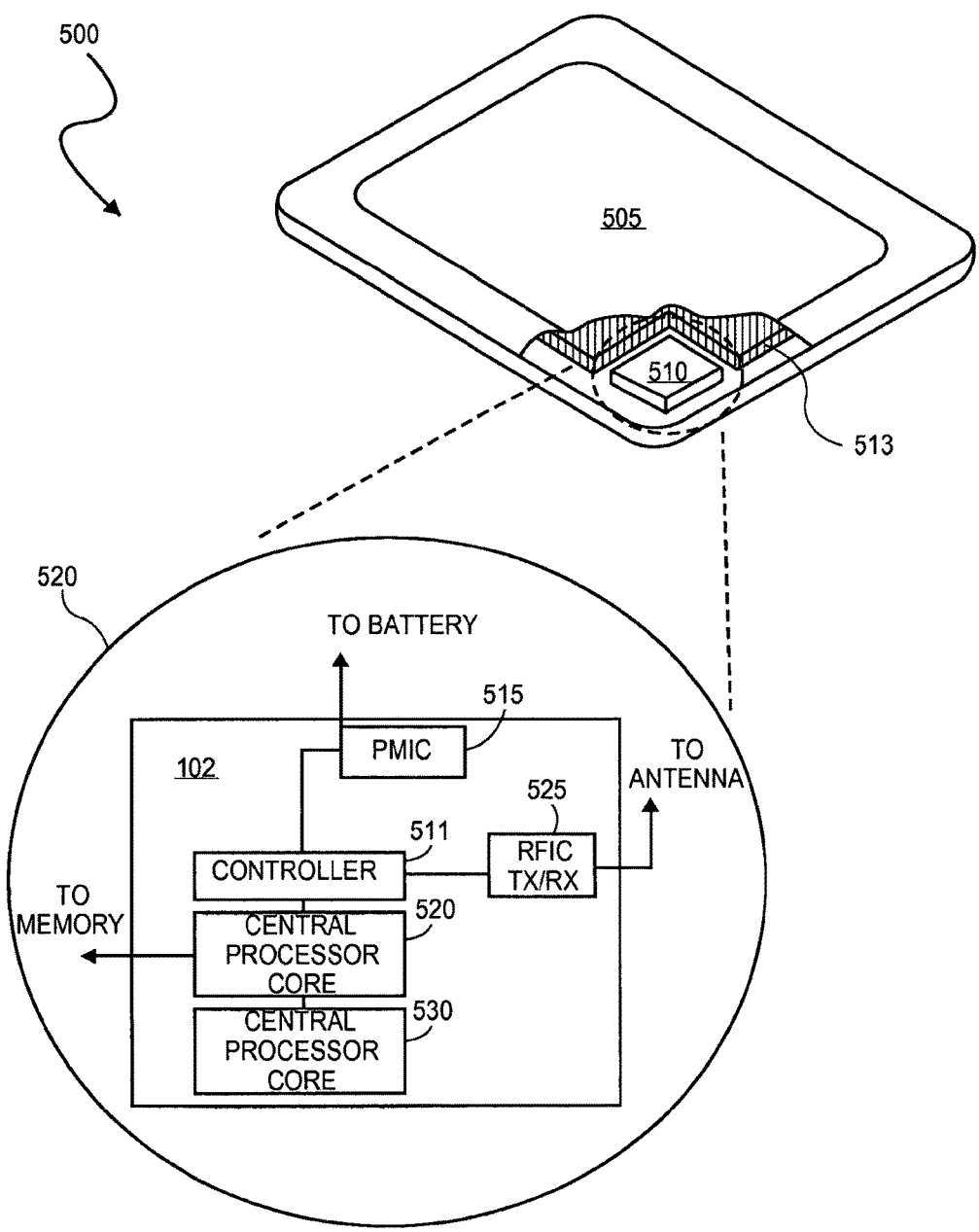
FIG. 5 illustrates an isometric view of a mobile computing device platform and schematic view of a microelectronic device employed by the mobile platform, in accordance with one embodiment.

In an embodiment, the high voltage III-N capacitors as described herein are monolithically integrated with III-N or group IV transistors. FIG. 5 is a functional block diagram of a SoC implementation of a mobile computing platform, in accordance with an embodiment of the present invention. The mobile computing platform 500 may be any portable device configured for each of electronic data display, electronic data processing, and wireless electronic data transmission. For example, mobile computing platform 500 may be any of a tablet, a smart phone, laptop computer, etc. and includes a display screen 505 that is in the exemplary embodiment a touchscreen (e.g., capacitive, inductive, resistive, etc.) permitting the receipt of user input, the SoC 510, and a battery 513. As illustrated, the greater the level of integration of the SoC 510, the more of the form factor within the mobile computing platform 500 that may be occupied by the battery 513 for longest operative lifetimes between charging, or occupied by memory (not depicted), such as a solid state drive for greatest functionality.

Depending on its applications, mobile computing platform 500 may include other components including, but not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The SoC 510 is further illustrated in the expanded view 520. Depending on the embodiment, the SoC 510 includes a portion of the silicon substrate 102 upon which two or more of a power management integrated circuit (PMIC) 515, RF integrated circuit (RFIC) 525 including a power amplifier operable to generate a carrier wave of a given frequency, a controller thereof 511, and one or more central processor core 530, 531 is fabricated. The RFIC 525 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond.

As will be appreciated by one of skill in the art, the functionally distinct circuit modules depicted in FIG. 5 typically employ MIM capacitors. In embodiments of the present invention however, at least one of the PMIC 515 and RFIC 525 employ one or more of the III-N MOS capacitors described herein (e.g., III-N MOS capacitor 101, 201, or 401). The III-N MOS capacitors described herein may be specifically utilized where high voltage swings are present (e.g., 7-10V battery power regulation, DC-to-DC conversion, etc.). As illustrated, in the exemplary embodiment the PMIC 515 has an input coupled to the battery 513 and has an output to provide a current supply to all the other functional modules in the SoC 510. Where additional ICs are provided within the mobile computing platform 500 but off the SoC 510, the PMIC 515 output may further provides a current supply to all these additional ICs off the SoC 510. In certain such embodiments, the higher voltage tolerance of III-N MOS capacitors described herein may enable passive portions of the PMIC 515 to be scaled to much smaller dimensions than a conventional PMIC architecture. As further illustrated, in the exemplary embodiment the RFIC 525 has an output coupled to an antenna and may further have an input coupled to a communication modules on the SoC 510, such as an RF analog and digital baseband module (not depicted). Alternatively, such communication modules may be provided on an IC off-chip from the SoC 510 and coupled into the SoC 510 for transmission. In certain embodiments, passive DC blocking capacitors and/or matching network capacitors within the RFIC 525 are III-N MOS capacitors.

In further embodiments, the PMIC 515 and RFIC 525 employing the III-N MOS capacitors described herein are monolithically integrated with one or more of the controller 511 and processor cores 530, 531, which are implemented exclusively in silicon CMOS technology onto the (silicon) substrate 102, or in a hybrid manner employing both silicon CMOS technology and III-N high electron mobility transistor (HEMT) technology. It will be appreciated that within the PMIC 515 and/or RFIC 525, the high voltage capable III-N MOS capacitors described herein need not be utilized in serial configuration to safely operate with +/−4V, or more across nodes of the capacitors. Notably, because the III-N MOS capacitor structures described herein may be readily configured to operate as three terminal MOS transistors without extensively modifying the material compositions or structural elements described herein, the integration of III-N MOS capacitors with silicon FETs described herein may be further combined with III-N MOS HEMTs that are well-suited to high voltage, high power, and/or high speed switching to arrive at a highly integrated monolithic SoC design.

Figure 6:
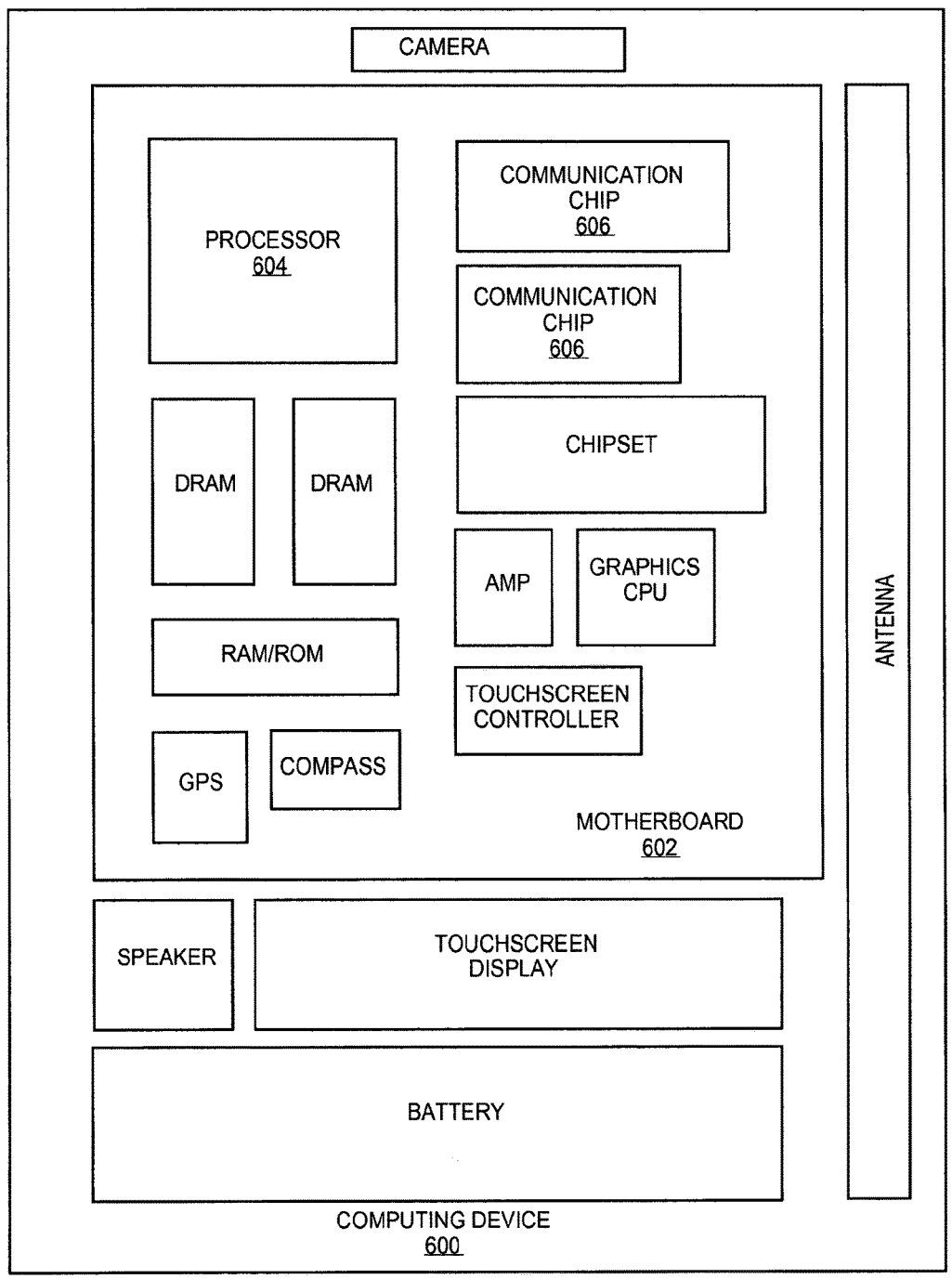
FIG. 6 illustrates a functional block diagram of computing device in accordance with one embodiment.

FIG. 6 is a functional block diagram of a computing device 600 in accordance with one embodiment of the invention. The computing device 600 may be found inside the mobile computing platform 500, for example, and further includes a board 602 hosting a number of components, such as but not limited to a processor 604 (e.g., an applications processor) and at least one communication chip 606. In embodiments, at least the processor 604 is integrated (e.g., on-chip) with a III-N MOS capacitor, in accordance with embodiments describe elsewhere herein. The processor 604 is physically and electrically coupled to the board 602. The processor 604 includes an integrated circuit die packaged within the processor 604. The term "processor" may refer to any device or portion of a device that processes electronic data from registers and/or memory to transform that electronic data into other electronic data that may be stored in registers and/or memory.

In some implementations the at least one communication chip 606 is also physically and electrically coupled to the board 602. In further implementations, the communication chip 606 is part of the processor 604. Depending on its applications, computing device 600 may include other components that may or may not be physically and electrically coupled to the board 602. These other components include, but are not limited to, volatile memory (e.g., DRAM), non-volatile memory (e.g., RAM or ROM) in the form of flash memory or STTM, etc., a graphics processor, a digital signal processor, a crypto processor, a chipset, an antenna, touchscreen display, touchscreen controller, battery, audio codec, video codec, power amplifier, global positioning system (GPS) device, compass, accelerometer, gyroscope, speaker, camera, and mass storage device (such as hard disk drive, solid state drive (SSD), compact disk (CD), digital versatile disk (DVD), and so forth).

At least one of the communication chips 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to those described elsewhere herein. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

Figure 7:
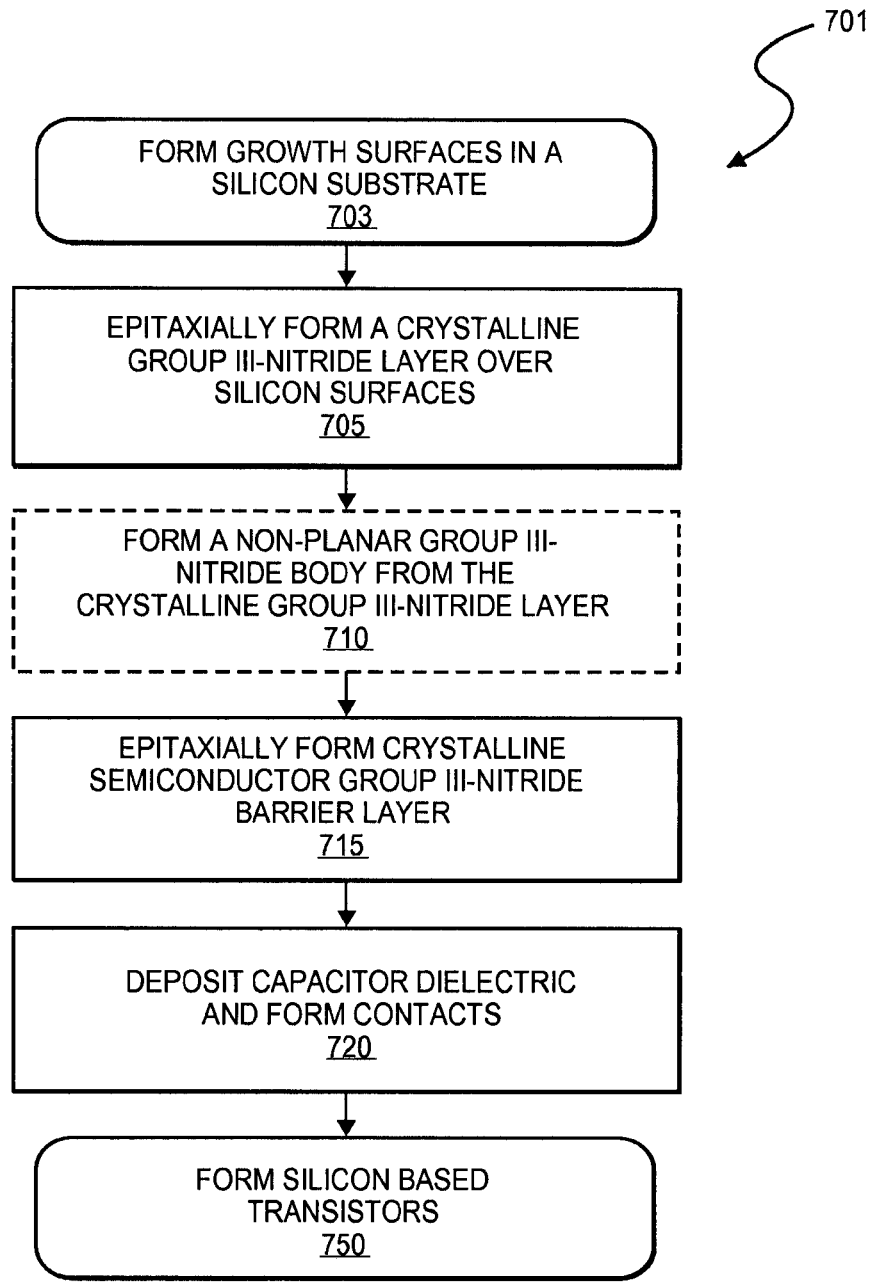
FIG. 7 is a flow chart illustrating a method of fabricating a III-N MOS capacitor with silicon-based transistors on a same silicon substrate, in accordance with an embodiment.
Figure 8:
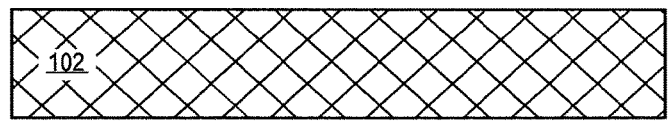
FIGS. 8, 9A, 9B, 9C, 9D, 10A, 10B, and 10C illustrate cross-sectional views of a III-N MOS capacitor integrated with silicon-based transistors on a same silicon substrate, in accordance with an embodiment.
Figure 9A:
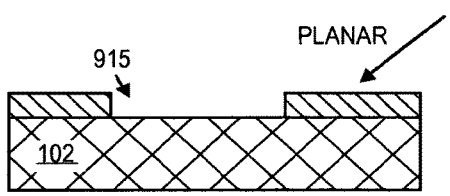
Figure 10A:
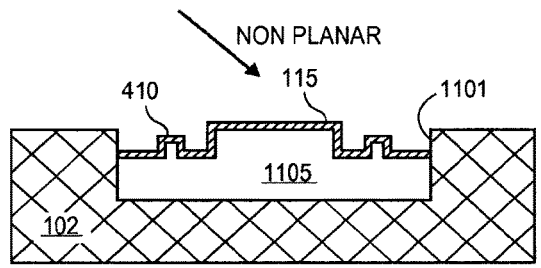
Figure 9B:
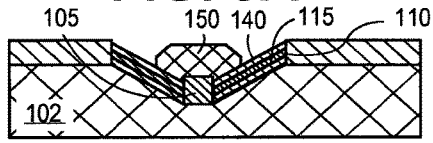
Figure 9C:
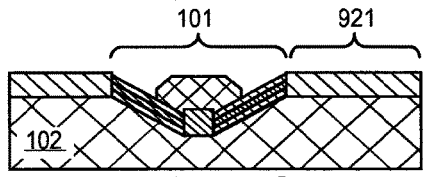
Figure 10B:
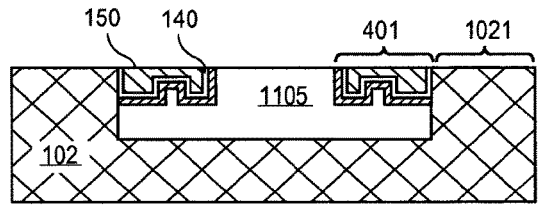
Figure 9D:
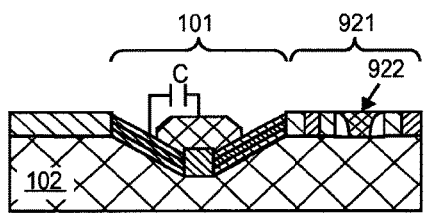
Figure 10C:
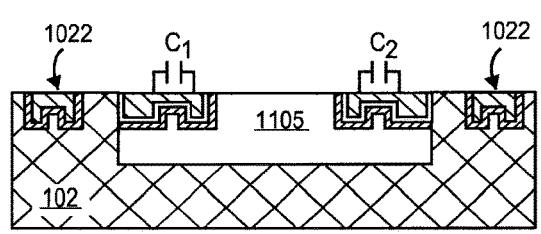
Figure 11:
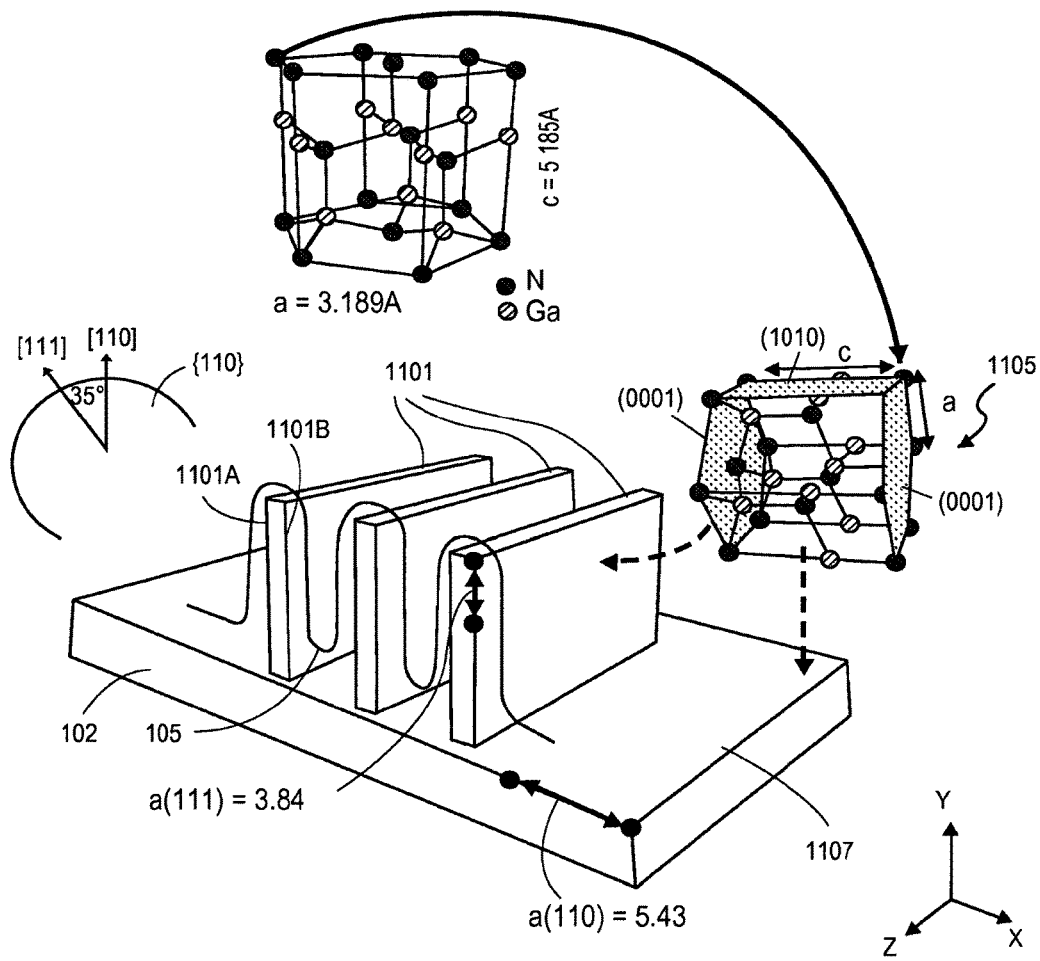
FIG. 11 is an isometric illustration of III-N semiconductor crystal polarity as grown on a single crystalline silicon substrate in a manner suitable for a non-planar III-N MOS capacitor, in accordance with an embodiment.

FIG. 7 is a flow chart illustrating a method 701 of fabricating a III-N MOS capacitor and a silicon-based transistor on a same substrate, in accordance with planar and non-planar embodiments. FIGS. 9A, 9B, 9C, and 9D illustrate cross-sectional views where planar III-N MOS capacitors adjacent to silicon transistors formed in separate regions of the starting substrate 102 depicted in FIG. 8. FIGS. 10A, 10B, and 10C illustrate cross-sectional views of non-planar III-N capacitors integrated with non-planar silicon-based transistors. FIG. 11 is an isometric illustration of III-N semiconductor crystal polarity as grown on a single crystalline silicon substrate in a manner suitable for a non-planar III-N MOS capacitor, in accordance with an embodiment.

Referring first to FIG. 7, the method 701 begins with forming growth surfaces in a silicon substrate at operation 703. In embodiments, the operation 703 entails etching a surface of a silicon substrate to expose a (111) silicon surface. In first embodiments, an anisotropic etch is performed, which may vary as a function of the crystal orientation of the substrate. For example, depending on the orientation of the silicon substrate 102 in FIG. 8, the anisotropic etch at operation 703 may either be crystallographic or simply result in a substantially vertical trench each exposing sidewalls in the substrate. As shown in FIG. 9A, where the substrate 802 is (100) silicon, a crystallographic etch at operation 703 may expose the (111) plane, for example by wet etching a v-groove into the exposed (100) surface 915 with a wet chemical etch (e.g., KOH solution).

As further shown in FIG. 10A and FIG. 11, for an alternative embodiment where the substrate 802 has (110) orientation, vertical etched sidewalls 1101 may fall substantially along a (111) plane. As shown in FIG. 11, by lithographically orientating the Si fins at 35° to the <110> crystal direction, the silicon fin sidewalls 1101A and 1101B exposed are along the (111) plane, having the lattice parameter of ~3.84 Å, which is better matched to the lattice parameter a of the (0001) and (000$\bar{1}$) planes of wurtzite (e.g., 3.189 Å for GaN). Similarly, the bottom silicon surface 1107 (being on the (110) plane with lattice parameter of 5.43 Å) is better matched with the c parameter of the (10$\bar{1}$0) plane of wurtzite (e.g., 5.185 Å for GaN). The (110) substrate surface along with the etched template fin sidewall 1101B serve to nucleate the GaN layer 1105 having the proper orientation. In an embodiment, a plurality of fins, each having a sidewall surface including a (111) plane is provided at operation 703. In embodiments, each of the plurality of non-planar silicon fins 1101 has a width:height aspect ratio of between 1:1 and 1:10 and a pitch of between 50 nm and 1 µm. Such multi-fin structures, properly spaced, establish intervening deep trenches well suited to defect trapping during subsequent epitaxial growth of III-N materials.

Returning to FIG. 7, the method 701 then continues with epitaxially forming a crystalline GaN semiconductor layer over the silicon surfaces at operation 705. In embodiments, a non-GaN semiconductor buffer layer may first be grown at operation 705. In other embodiments, a GaN layer is epitaxially grown directly on a (111) silicon surface. In certain such embodiments, a blocking mask may be first formed over non-(111) surfaces of the substrate (e.g., (100) surfaces, (110) surfaces). As shown in FIG. 9B for example, the blocking mask 105 may be deposited and patterned by conventional techniques, following operation 703, as a preface to epitaxially growing the GaN layer. For non-planar embodiments, as illustrated in FIG. 11, matching between the wurtzite crystal planes and silicon crystal planes can be improved through orientation of a silicon fin 1101 patterned into a large diameter (300 mm) silicon (110) substrate 102 to expose the silicon (111) plane on first and second opposite sidewalls 1101A and 1101B of the fin 1101. Notably, where the GaN layer is only a thin layer grown on substantially vertical (111) silicon sidewalls (e.g., the technique illustrated in FIG. 11 is terminated before the GaN layer 1105 fills the template fin topography), a substantially planar III-N MOS capacitor may also be formed like that of the III-N MOS capacitor 101 except with the more extreme angle (e.g., ~90° instead of 55°) relative the surface of the substrate.

For non-planar III-N MOS capacitor embodiments, the method 701 continues with operation 710 where a non-planar body is formed from the GaN layer grown at operation 705. For example, as shown in FIG. 10A, the non-planar GaN body 410 is formed by recessing a portion of the GaN layer 1105 through any conventional patterning and anisotropic etch of the GaN layer.

The method 701 (FIG. 7) then proceeds to operation 715 where the III-N barrier layer is epitaxial grown on the GaN layer. FIG. 9B illustrates an exemplary planar embodiment where the GaN layer 110 is covered with the barrier layer 115. FIG. 10A illustrates another exemplary embodiment where the non-planar GaN body 310 is covered with the barrier layer 115. Doped semiconductor contact regions may be selectively grown epitaxially or deposited as a polycrystalline material. At operation 715 (FIG. 7), the capacitor dielectric and capacitor contacts are then formed. As further shown in both FIGS. 9B and 10B, formation of the capacitor dielectric layer 140 including any of the metal oxides, or other materials described elsewhere herein, is advantageously deposited conformally, for example by an ALD technique.

At operation 720, contact metals (e.g., first contact metals 150 illustrated in FIGS. 9B and 10) are then advantageously deposited conformally, for example, by and ALD technique, or nonconformally using conventional PVD techniques. The method 701 then completes with formation of a silicon-based transistor at operation 750. As shown in FIGS. 9C and 9D, a region 921 adjacent to the III-N MOS capacitor 101 may be utilized to form a planar (or non-planar) silicon field effect transistor 922 using any technique known in the art. Similarly, as shown in FIG. 10C, a region 1021 adjacent to the III-N MOS capacitor 401 may be utilized to form a non-planar (or planar) silicon field effect transistor 1022 using any technique known in the art. Notably, the order of the operations in the method 701 may vary, and one or more operation being performed simultaneously for one or both of a III-N MOS capacitor and a silicon-based transistor. Once transistor-level monolithic integration is complete, circuit fabrication may be completed using any interconnection process suitable for silicon CMOS technology to electrically connect a III-N MOS capacitor into a circuit further including a silicon field effect transistor. Packaging and assembly into a device, such as a mobile computing platform, may then proceed conventionally.

Hence, embodiments of III-N MOS capacitors, their manufacture, and their integration with silicon and/or GaN MOS transistors are described. In embodiments, a depletion mode III-N metal-oxide-semiconductor (MOS) capacitor, comprises a silicon substrate; a GaN layer disposed over the silicon substrate; a III-N barrier layer disposed on a (0001) surface of the GaN layer; a dielectric layer disposed over the III-N barrier layer, a first contact metal disposed on the dielectric layer; and a second contact metal disposed on an n-type semiconductor region disposed in contact with the GaN layer and electrically connected to a two dimensional electron gas (2DEG) present in the GaN layer proximate an interface between the GaN layer and the III-N barrier layer for voltages across the first and second contact metals that are above a negative threshold voltage.

In embodiments, the GaN layer has wurtzite crystallinity with a c-axis oriented perpendicular to a top surface of the silicon substrate over which the GaN layer is disposed; and wherein the III-N layer comprises $Al_{1-x-y}In_xGa_yN$. In embodiments, the surface of the silicon substrate is a (111) silicon surface. In embodiments, the substrate is a (001) substrate and the GaN layer is disposed within a v-groove formed in the substrate, the v-groove having the (111) silicon surface. In embodiments, the substrate is a (110) substrate and wherein the GaN layer is disposed on a (111) sidewall of a non-planar silicon body formed in the substrate, and wherein the (0001) surface is a sidewall of a non-planar GaN body formed in the GaN layer. In embodiments, the surface of the silicon substrate is a (100) silicon surface, and wherein the GaN layer is disposed on a semiconductor buffer layer disposed on the (100) silicon surface. In embodiments, the capacitor further comprises a third contact disposed on a second n-type semiconductor electrically connected to the 2DEG on a side of the first contact opposite the second contact, wherein the second and third contacts are electrically connected as one voltage node of the capacitor. In embodiments, the first and second contact metals have a work function of 4.6 eV, or lower, the dielectric layer comprises one layer or a stack of layers with at least one dielectric layer of dielectric constant greater than 7. In embodiments, the capacitor has a breakdown voltage exceeding 4V across the first and second contacts.

In embodiments, a system on chip (SoC), comprises a power management integrated circuit (PMIC) including at least one of a switching voltage regulator or switching mode DC-DC converter; and an RF integrated circuit (RFIC) including a power amplifier operable to generate a carrier wave, wherein both of the PMIC and RFIC are monolithically integrated onto a same substrate, and wherein at least one of PMIC and RFIC include at least one III-N MOS capacitor. In embodiments, the at least one group III-nitride MOS capacitor has a breakdown voltage that is no less than 4 volts. In embodiments, the III-N MOS capacitor is connected within the PMIC or RFIC as at least one of: a DC blocking capacitor or charge storage element in a charge pump. In embodiments, a controller of at least one of the PMIC and RFIC integrated onto the substrate, wherein the controller comprises silicon field effect transistors. In embodiments, the silicon field effect transistors are disposed over regions of the substrate comprising a crystalline silicon surface and wherein the at least one III-N MOS capacitor comprising a crystalline GaN layer is disposed a second region of the substrate.

In embodiments, a mobile computing device, comprises a touchscreen; a battery; an antenna; and the SoC as described herein, where the PMIC is coupled to the battery and where the RFIC is coupled to the antenna. In embodiments, the mobile computing device includes a first and second processor core, each core operably coupled to the touchscreen, the PMIC and RFIC, and wherein the first and second processor cores comprise silicon field effect transistors.

In embodiments, a method of integrating high voltage capacitors on a substrate includes forming a plurality of high voltage III-N MOS capacitors on the substrate, the forming further including forming a stack of III-N semiconductor material layers including a GaN layer disposed over the substrate, and a III-N barrier layer disposed on a (0001) surface of the GaN layer; depositing a dielectric layer over the III-N barrier layer; forming a first contact metal on the dielectric layer; forming an n-type semiconductor region disposed in contact with the GaN layer; and forming a second contact metal disposed on the n-type semiconductor region and electrically connected to a two dimensional electron gas (2DEG) present in the GaN layer proximate an interface between the GaN layer and the III-N barrier layer for voltages across the first and second contact metals that are above a negative threshold voltage. In embodiments, forming a stack of III-N semiconductor material layers further comprises: etching a surface of a silicon substrate to expose a (111) silicon surface; epitaxially growing the GaN layer on the exposed (111) silicon surface; and wherein forming the III-N barrier layer further comprises epitaxially growing at least one of $Al_{1-x-y}In_xGa_yN$, or AlN on the GaN layer. In embodiments, etching the surface further comprises wet etching a v-groove in a (100) surface of the substrate to expose the (111) surface, or wherein etching the surface further comprises dry etching trench into a (110) surface of the substrate to expose the (111) surface along a sidewall of the trench. In embodiments, epitaxially growing the GaN layer further comprises forming an epitaxial growth blocking mask over non-(111) surfaces of the substrate. In embodiments, depositing the dielectric layer further comprises depositing a metal oxide by atomic layer deposition. In embodiments, the method further comprises forming a silicon-based field effect transistor on the silicon substrate adjacent to the III-N MOS capacitor.

It is to be understood that the above description is intended to be illustrative, and not restrictive. Although the present invention has been described with reference to specific exemplary embodiments, it will be recognized that the invention is not limited to the embodiments described, but can be practiced with modification and alteration within the spirit and scope of the appended claims. The scope of the invention should, therefore, be determined with reference to the appended claims, along with the full scope of equivalents to which such claims are entitled.

What is claimed is:

1. A III-N metal-oxide-semiconductor (MOS) capacitor, comprising:
a (001) silicon substrate having a trench formed therein with (111) sidewalls and a (001) bottom;
a first dielectric layer on the (001) bottom of the trench;
a GaN layer disposed along at least one of the (111) sidewalls of the trench but not over the first dielectric layer on the (001) bottom of the trench;
a III-N barrier layer disposed on a (0001) surface of the GaN layer; a second dielectric layer disposed over the III-N barrier layer;
a first contact metal disposed on the second dielectric layer; and
a second contact metal disposed on an n-type semiconductor region disposed in contact with the GaN layer and electrically connected to a two dimensional electron gas (2DEG) present in the GaN layer proximate an interface between the GaN layer and the III-N barrier layer.

2. The III-N MOS capacitor of claim 1, wherein the GaN layer has wurtzite crystallinity.

3. The III-N MOS capacitor of claim 1, wherein the III-N layer comprises Al-x-yInxGayN.

4. The III-N MOS capacitor of claim 1, further comprising a third contact disposed on a second n-type semiconductor electrically connected to the 2DEG on a side of the first contact opposite the second contact.

5. The III-N MOS capacitor of claim 4, wherein the second and third contacts are electrically connected as one voltage node of the capacitor.

6. The III-N MOS capacitor of claim 1, wherein the first and second contact metals have a work function of 4.6 eV, or lower.

7. The III-N MOS capacitor of claim 1, wherein the second dielectric layer is a single layer or one in a stack of compositionally distinct layers.

8. The III-N MOS capacitor of claim 1, wherein the second dielectric layer has a dielectric constant greater than 7.

9. The III-N MOS capacitor of claim 1, wherein the capacitor has a breakdown voltage exceeding 4V across the first and second contacts.

10. A III-N metal-oxide-semiconductor (MOS) capacitor, comprising:
a (110) silicon substrate having a non-planar silicon body formed therein, the non-planar silicon body having a (111) sidewall;
a GaN layer disposed on the (111) sidewall of the non-planar silicon body;
a III-N barrier layer disposed on a (0001) surface of the GaN layer, wherein the (0001) surface of the GaN layer is a sidewall of a non-planar GaN body formed in the GaN layer;
a dielectric layer disposed over the III-N barrier layer;
a first contact metal disposed on the dielectric layer; and
a second contact metal disposed on an n-type semiconductor region disposed in contact with the GaN layer and electrically connected to a two dimensional electron gas (2DEG) present in the GaN layer proximate an interface between the GaN layer and the III-N barrier layer.

11. The III-N MOS capacitor of claim 10, wherein the GaN layer has wurtzite crystallinity.

12. The III-N MOS capacitor of claim 10, wherein the III-N layer comprises $Al_{1-x-y}In_xGa_yN$.

13. The III-N MOS capacitor of claim 10, further comprising a third contact disposed on a second n-type semiconductor electrically connected to the 2DEG on a side of the first contact opposite the second contact.

14. The III-N MOS capacitor of claim 13, wherein the second and third contacts are electrically connected as one voltage node of the capacitor.

15. The III-N MOS capacitor of claim 10, wherein the first and second contact metals have a work function of 4.6 eV, or lower.

16. The III-N MOS capacitor of claim 10, wherein the dielectric layer is a single layer.

17. The III-N MOS capacitor of claim 10, wherein the dielectric layer is one in a stack of compositionally distinct layers.

18. The III-N MOS capacitor of claim 10, wherein the dielectric layer has a dielectric constant greater than 7.

19. The III-N MOS capacitor of claim 10, wherein the capacitor has a breakdown voltage exceeding 4V across the first and second contacts.

20. A III-N metal-oxide-semiconductor (MOS) capacitor, comprising:
a (001) silicon substrate having a trench formed therein with (111) sidewalls; a GaN layer disposed the trench of the (001) silicon substrate;
a III-N barrier layer disposed on a (0001) surface of the GaN layer; a dielectric layer disposed over the III-N barrier layer;
a first contact metal disposed on the dielectric layer;
a second contact metal disposed on an n-type semiconductor region disposed in contact with the GaN layer and electrically connected to a two dimensional electron gas (2DEG) present in the GaN layer proximate an interface between the GaN layer and the III-N barrier layer; and a third contact disposed on a second n-type semiconductor electrically connected to the 2DEG on a side of the first contact opposite the second contact, wherein the second and third contacts are electrically connected as one voltage node of the capacitor.

21. A III-N metal-oxide-semiconductor (MOS) capacitor, comprising:
a (001) silicon substrate having a trench formed therein with (111) sidewalls;
a first dielectric layer on a (001) bottom of the trench;
a GaN layer disposed in the trench of the (001) silicon substrate but not over the first dielectric layer on the (001) bottom of the trench;
a III-N barrier layer disposed on a (0001) surface of the GaN layer;
a second dielectric layer disposed over the III-N barrier layer;
a first contact metal disposed on the second dielectric layer; and
a second contact metal disposed on an n-type semiconductor region disposed in contact with the GaN layer and electrically connected to a two dimensional electron gas (2DEG) present in the GaN layer proximate an interface between the GaN layer and the III-N barrier layer, wherein the capacitor has a breakdown voltage exceeding 4V across the first and second contacts.

22. A III-N metal-oxide-semiconductor (MOS) capacitor, comprising:
a (110) silicon substrate having a non-planar silicon body formed therein, the non-planar silicon body having a (111) sidewall;

a GaN layer disposed on the (111) sidewall of the non-planar silicon body; a III-N barrier layer disposed on a (0001) surface of the GaN layer;

a dielectric layer disposed over the III-N barrier layer;

a first contact metal disposed on the dielectric layer;

a second contact metal disposed on an n-type semiconductor region disposed in contact with the GaN layer and electrically connected to a two dimensional electron gas (2DEG) present in the GaN layer proximate an interface between the GaN layer and the III-N barrier layer; and a third contact disposed on a second n-type semiconductor electrically connected to the 2DEG on a side of the first contact opposite the second contact, wherein the second and third contacts are electrically connected as one voltage node of the capacitor.

23. A III-N metal-oxide-semiconductor (MOS) capacitor, comprising: a (110) silicon substrate having a non-planar silicon body formed therein, the non-planar silicon body having a (111) sidewall;

a GaN layer disposed on the (111) sidewall of the non-planar silicon body; a III-N barrier layer disposed on a (0001) surface of the GaN layer;

a dielectric layer disposed over the III-N barrier layer;

a first contact metal disposed on the dielectric layer; and a second contact metal disposed on an n-type semiconductor region disposed in contact with the GaN layer and electrically connected to a two dimensional electron gas (2DEG) present in the GaN layer proximate an interface between the GaN layer and the III-N barrier layer, wherein the capacitor has a breakdown voltage exceeding 4V across the first and second contacts.

\* \* \* \* \*